(12) United States Patent
Furukubo

(10) Patent No.: US 9,056,788 B2
(45) Date of Patent: Jun. 16, 2015

(54) GLASS CERAMIC SINTER, REFLECTIVE MEMBER AND SUBSTRATE FOR MOUNTING A LIGHT-EMITTING-ELEMENT, AND LIGHT-EMITTING DEVICE

(75) Inventor: Youji Furukubo, Kirishima (JP)

(73) Assignee: Kyocera Corporation, Kyoto (JP)

(*) Notice: Subject to any disclaimer, the term of this patent is extended or adjusted under 35 U.S.C. 154(b) by 390 days.

(21) Appl. No.: 13/806,695

(22) PCT Filed: Jun. 21, 2012

(86) PCT No.: PCT/JP2012/065829
§ 371 (c)(1),
(2), (4) Date: Dec. 21, 2012

(87) PCT Pub. No.: WO2013/002113
PCT Pub. Date: Jan. 3, 2013

(65) Prior Publication Data
US 2014/0042891 A1     Feb. 13, 2014

(30) Foreign Application Priority Data

Jun. 29, 2011 (JP) .................................. 2011-144437
Sep. 29, 2011 (JP) .................................. 2011-214811

(51) Int. Cl.
*F21V 7/00* (2006.01)
*C03C 14/00* (2006.01)
*H01L 33/60* (2010.01)
*C03C 10/00* (2006.01)
*C03C 10/16* (2006.01)

(52) U.S. Cl.
CPC .............. *C03C 14/006* (2013.01); *Y10T 428/23* (2015.01); *H01L 33/60* (2013.01); *C03C 10/0036* (2013.01); *C03C 10/16* (2013.01); *F21V 7/00* (2013.01)

(58) Field of Classification Search
CPC ......................................................... F21V 7/00
See application file for complete search history.

(56) References Cited

FOREIGN PATENT DOCUMENTS

| | | |
|---|---|---|
| JP | 2005-111788 | 4/2005 |
| JP | 2007-230821 | 9/2007 |
| JP | 2009-064842 | 3/2009 |
| JP | 2010-195655 | 9/2010 |
| WO | WO 2011/126012 A1 | 10/2011 |

*Primary Examiner* — Elmito Breval
(74) *Attorney, Agent, or Firm* — Duane Morris LLP

(57) ABSTRACT

A glass ceramic sinter is disclosed. The glass ceramic sinter includes a glass matrix, and anorthite grains, fersmite grains and quartz grains, all of which are in the glass matrix. A total content of the glass matrix, the anorthite grains, the quartz grains, and the fersmite grains is 98% or more by mass of the glass ceramic sinter.

6 Claims, 2 Drawing Sheets

GLASS CERAMIC SINTER, REFLECTIVE MEMBER AND SUBSTRATE FOR MOUNTING A LIGHT-EMITTING-ELEMENT, AND LIGHT-EMITTING DEVICE

TECHNICAL FIELD

The present invention relates to a glass ceramic sinter having good shape processability, a reflective member and a light-emitting-element-mounting substrate that include the glass ceramic sinter, and a light-emitting device.

BACKGROUND ART

In recent years, light-emitting devices including light-emitting elements have been improved so as to have higher luminance and emit white light and have been used as backlights for cellular phones, large liquid-crystal televisions, and the like. In particular, glass ceramic sinter has been attracting attention because it has high reflectivity and, in addition, it has high heat resistance and high durability and does not deteriorate even under exposure to ultraviolet radiation for a long period of time, compared with synthetic resins having been used for existing substrates for mounting light-emitting elements.

For example, Patent Literature 1 discloses a glass ceramic sinter formed from, as ceramic raw materials, borosilicate glass, alumina, a group 2 element such as calcium, and metal niobium or niobium oxide so that it has high reflectivity in the visible-light range.

CITATION LIST

Patent Literature

PTL 1: Japanese Unexamined Patent Application Publication No. 2009-64842

SUMMARY OF INVENTION

Technical Problem

However, since the glass ceramic sinter disclosed in PTL 1 contains alumina grains having high hardness therein, it has the following problem. In the step of shape processing or cutting employing a dicing saw or the like, defects due to cracking or grain pull-out tend to be generated in the surface of the glass ceramic sinter.

In addition, the glass ceramic sinter has a problem of low light reflectivity in the near-ultraviolet wavelength range, which is not within the visible-light range.

Accordingly, an object of the present invention is to provide a glass ceramic sinter in which defects due to cracking or grain pull-out are less likely to be generated in the surface of the glass ceramic sinter during the step of shape processing or cutting and the light reflectivity in the near-ultraviolet wavelength range is high; a reflective member and a substrate that includes the glass ceramic sinter for mounting a light-emitting-element; and a light-emitting device.

Solution to Problem

A glass ceramic sinter according to the present invention includes a glass matrix, and anorthite grains, fersmite grains, and quartz grains, all of which are in the glass matrix. A total content of the glass matrix, the anorthite grains, the quartz grains, and the fersmite grains is 98% or more by mass of the glass ceramic sinter.

A reflective member according to the present invention includes the above-described glass ceramic sinter.

A substrate for mounting a light-emitting-element includes an insulating base and a reflective member. The insulating base includes a surface and a mounting section on the surface. The reflective member is disposed on the surface and surrounding the mounting section. At least one of the insulating base and the reflective member includes the above-described glass ceramic sinter.

A light-emitting device includes a light-emitting element mounted on the mounting section of the above-described substrate.

Advantageous Effects of Invention

The present invention can provide a glass ceramic sinter in which defects due to cracking or grain pull-out are less likely to be generated in the surface of the glass ceramic sinter during the step of shape processing or cutting and the light reflectivity in the near-ultraviolet wavelength range is high; a reflective member, a substrate for mounting a light-emitting-element, and a light-emitting device that include the glass ceramic sinter.

BRIEF DESCRIPTION OF DRAWINGS

FIG. 1 (b) is a cross-sectional view taken along line A-A in FIG. 1 (a).

DESCRIPTION OF EMBODIMENTS

Figure 1:
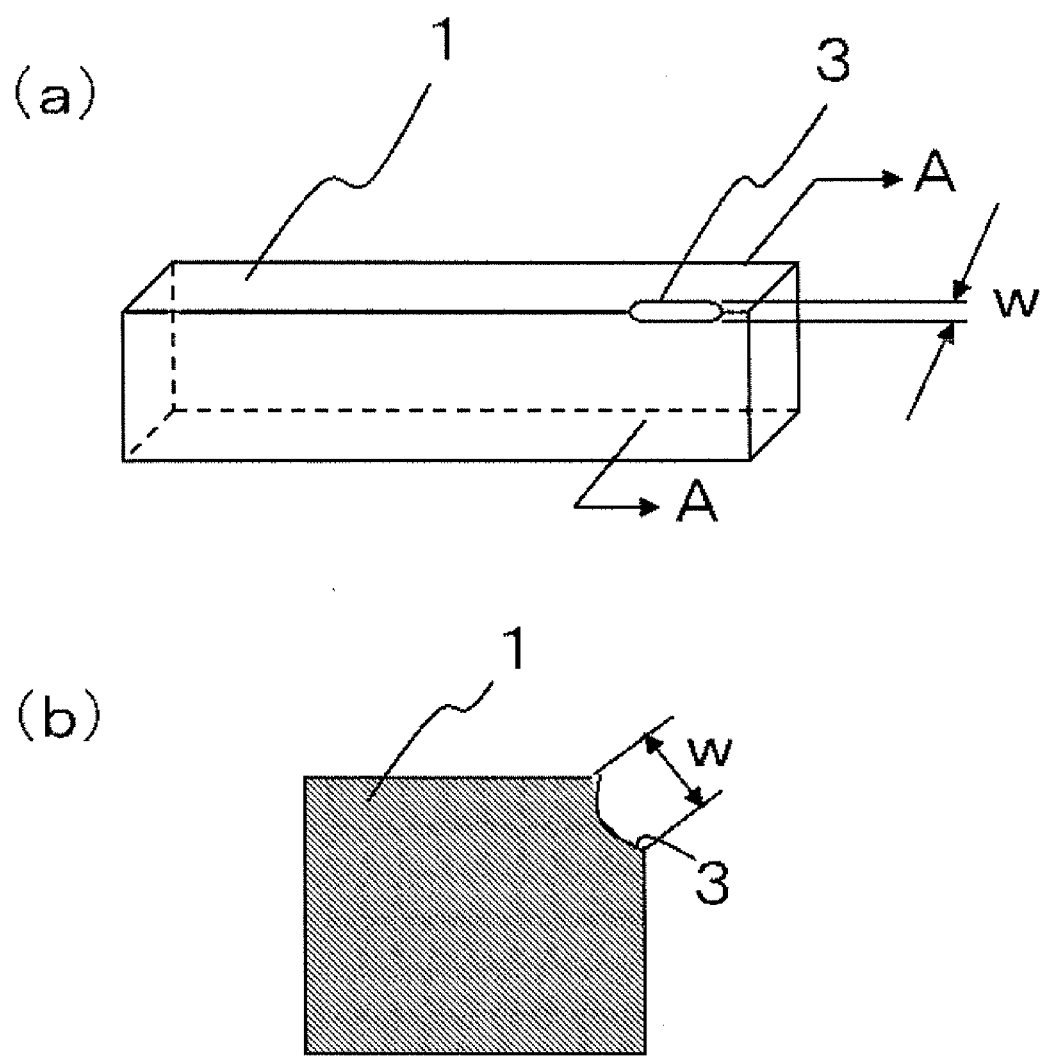
FIG. 1 (a) is a perspective view of a glass ceramic sinter of the present embodiment having been cut from a mother substrate.

A glass ceramic sinter serving as an example of the present embodiment will be described on the basis of FIG. 1. FIG. 1 (a) is a perspective view of a glass ceramic sinter of the present embodiment having been cut from a mother substrate. FIG. 1 (b) is a cross-sectional view taken along line A-A in FIG. 1 (a).

A glass ceramic sinter 1 of the present embodiment includes a glass matrix, and anorthite grains, fersmite grains and quartz grains, all of which are in the glass matrix. A total content of the glass matrix, the anorthite grains, the quartz grains, and the fersmite grains is 98% or more by mass of the glass ceramic sinter 1.

The glass ceramic sinter 1 of the present embodiment includes a structure in which crystal grains such as the anorthite grains, the quartz grains, and the fersmite grains are present in the matrix of the glass. Accordingly, the surface of the glass ceramic sinter 1 is covered with the glass matrix. Thus, the size of defects such as chipping due to grain pull-out of filler or a crystal grains in the near-surface region of the glass ceramic sinter 1 can be decreased.

In the glass ceramic sinter 1 of the present embodiment, even quartz (α-quartz), which has the highest hardness among the crystal grains contained in the glass matrix, has a Mohs hardness of about 7. Accordingly, compared with the glass ceramic sinter 1 including a crystal grain having a Mohs hardness higher than 7 such as alumina (Mohs hardness: 9), the size of defects 3 due to cracking, grain pull-out, or the like can be decreased not only in the surface but also inside of the glass ceramic sinter 1 during the step of shape processing or cutting.

As described above, the glass ceramic sinter 1 of the present embodiment includes as main grains, in the glass matrix, the quartz grains (α-quartz, refractive index: 1.45), the anorthite grains ($CaAl_2Si_2O_8$, refractive index: 1.58), and the fersmite grains ($CaNb_2O_6$, refractive index: 2.2 to 2.4). In this case, light reflectivity in the visible-light wavelength range (wavelength: 400 to 700 nm) can be made 80% or more and light reflectivity in the near-ultraviolet wavelength range (380 nm or less), which covers shorter wavelengths than the visible-light wavelength range, can be made 69% or more.

This is because the glass ceramic sinter has the following structure: the surface is covered with the glass matrix; and in the glass matrix of the surface and in the region underlying the glass matrix, the anorthite grains and the fersmite grains are together dispersed around the quartz grains. In this case, the anorthite grains and the fersmite grains desirably have an average grain size of about 1 μm (the grain-size range is 0.1 to 1.5 μm). When the anorthite grains and the fersmite grains have such a small average grain size, the crystal grains having a small grain size can reflect short-wavelength light. In addition, light tends to undergo diffused reflection in the near-surface region of the glass ceramic sinter.

In contrast, when the total content of the glass matrix, the anorthite grains, the quartz grains, and the fersmite grains in the glass ceramic sinter 1 is less than 98% by mass, large defects tend to be generated during shape processing and light reflectivity in the near-ultraviolet wavelength range (380 nm or less) also becomes less than 69%.

In the glass ceramic sinter of the present embodiment, light reflectivity in the wavelength range of 380 nm or less can be made 85% or more when the content of the glass matrix is 16% to 28% by mass, the content of the anorthite grains is 33% to 45% by mass, the content of the quartz grain is 5% to 20% by mass, the content of the fersmite grains is 17% to 46% by mass, and the quartz grains have an average grain size of 1.8 to 9.0 μm.

In the glass ceramic sinter of the present embodiment, light reflectivity in the wavelength range of 380 nm or less can be made higher, 87% or more, when the content of the glass matrix is 18% to 27% by mass, the content of the anorthite grains is 36% to 45% by mass, the content of the quartz grains is 5% to 10% by mass, the content of the fersmite grains is 23% to 41% by mass, and the quartz grains have an average grain size of 1.8 to 3.6 μm.

Figure 2:
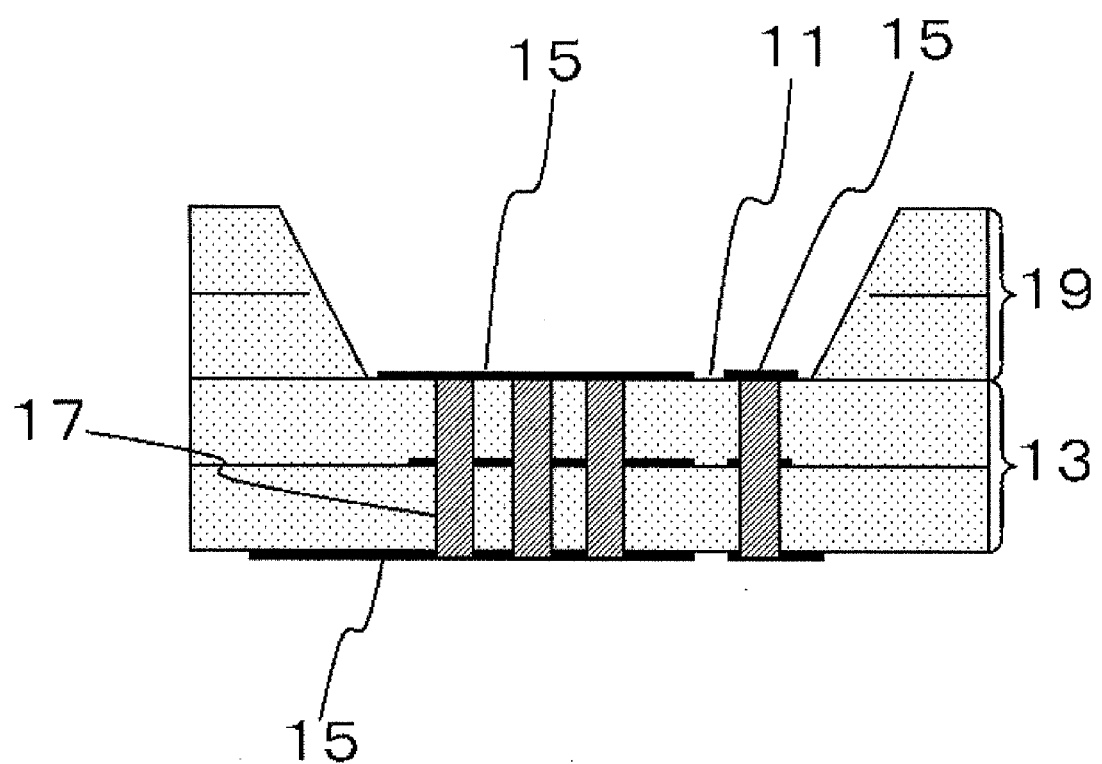
FIG. 2 is a cross-sectional view illustrating an example of a light-emitting-element-mounting substrate of the present embodiment.

Next, an example in which the glass ceramic sinter 1 of the present embodiment is applied to a substrate for mounting a light-emitting-element will be described. FIG. 2 is a cross-sectional view illustrating an example of a substrate for mounting light-emitting-element of the present embodiment.

The substrate for mounting light-emitting-element of the present embodiment includes an insulating base 13 including a mounting section 11 in order to mount the light-emitting element (not shown), conductor layers 15 disposed on the upper and lower surfaces of the insulating base 13, feedthrough conductors 17 that interconnect the conductor layers 15 disposed on the upper and lower surfaces of the insulating base 13, and a reflective member 19 disposed on the upper surface of the insulating base 13 and surrounds the mounting section 11; and at least one of the insulating base 13 and the reflective member 19 includes the glass ceramic sinter 1 of the present embodiment.

As described above, the glass ceramic sinter 1 of the present embodiment has good shape processability in terms of cutting, polishing, or the like and the size of the defects 3 generated in the surface of the glass ceramic sinter 1 can be decreased. Accordingly, when the glass ceramic sinter 1 is applied to at least one of the insulating base 13 and the reflective member 19 of a substrate for mounting a light-emitting-element, a substrate for mounting light-emitting-element can be obtained in which the size of the defects 3 is small and the reflectivity is high not only in the visible-light range but also in the near-ultraviolet wavelength range having a wavelength of less than 400 nm. In this case, in order to decrease fraction defective in the appearance inspection of the substrate for mounting light-emitting-element, the maximum size of the defects 3 (width w in FIG. 1(*b*)) is desirably 90 μm or less.

In a light-emitting device in which a light-emitting element is mounted on the mounting section 11 of the substrate for mounting light-emitting-element, at least one of the insulating base 13 and the reflective member 19 of the substrate for mounting light-emitting-element has high reflectivity not only in the visible-light range but also in the near-ultraviolet wavelength range having a wavelength of less than 400 nm. Accordingly, the light-emitting device has high light-emitting characteristics over a wide wavelength range.

Next, a method for producing the glass ceramic sinter 1 of the present embodiment will be described. A raw-material powder is first prepared: a glass powder, a quartz powder, and a $Nb_2O_5$ powder. In this case, the glass powder is preferably a borosilicate glass powder containing Si, B, Al, Ca, Mg, and Zn because the anorthite grains ($CaAl_2Si_2O_8$) tend to be deposited. When the raw-material powder contains the $Nb_2O_5$ powder, the $Nb_2O_5$ powder and oxide of an alkaline-earth element such as Ca forming the glass powder tend to form the fersmite grains ($CaNb_2O_6$) having a high refractive index. Thus, the glass ceramic sinter 1 having high light reflectivity can be obtained. In this case, in the raw-material powder, the content of the quartz powder is desirably 2% to 20% by mass, in particular, 5% to 10% by mass; and the quartz powder preferably has an average particle size of 1 to 30 μm, in particular, 4 to 10 μm.

The content of the $Nb_2O_5$ powder in the raw-material powder is desirably 5% to 40% by mass, in particular, 20% to 35% by mass. The $Nb_2O_5$ powder desirably has a smaller average particle size than the quartz powder. The $Nb_2O_5$ powder preferably has an average particle size of 0.3 to 1.0 μm, in particular, 0.3 to 0.8 μm. When a $Nb_2O_5$ powder having an average particle size of 1 μm or less is used in the raw-material powder, a fine-grain fersmite grains can be formed around the quartz grains and the anorthite grains can also be formed as fine grains. As a result, the glass ceramic sinter 1 having higher light reflectivity in the ultraviolet and near-ultraviolet wavelength range can be obtained.

The glass powder, the quartz powder, the $Nb_2O_5$ powder, and an organic vehicle are then mixed with a stirring mixer such as a ball mill to thereby prepare a mixture to be shaped.

This prepared mixture is then shaped so as to have a predetermined shape and subsequently fired at a temperature of 800° C. to 1000° C. Thus, the glass ceramic sinter of the present embodiment or a reflective member including the glass ceramic sinter can be obtained.

The insulating base 13 of a substrate for mounting light-emitting-element is produced in the following manner. The mixture to be shaped is turned into slurry and then formed into sheet-shaped bodies by a shaping process such as a doctor-blade process. The sheet-shaped bodies are then punched to form through holes. Among the resultant sheet-shaped bodies, in sheet-shaped bodies that are to be provided with the conductor layers 15 and the feedthrough conductors 17, conductor patterns are then formed with conductor paste mainly containing Ag or Cu. The sheet-shaped bodies provided with the conductor patterns and optionally sheet-shaped bodies not provided with the conductor patterns are subsequently combined so that they are laminated to provide a green laminated body including a desired number of layers. After that, the green laminated body is fired under predetermined conditions to produce a mother substrate that is to provide light-emitting-element-mounting substrates.

The mother substrate is then cut to predetermined dimensions to provide the insulating base 13 of a substrate for mounting light-emitting-element of the present embodiment. When the mother substrate is formed of the glass ceramic sinter of the present embodiment, in the step of cutting or shape processing, generation of defects due to cracking or grain pull-out in the surface of the glass ceramic sinter can be suppressed. Thus, a substrate for mounting light-emitting-element having good appearance and good light reflective characteristics can be obtained.

EXAMPLES

A raw-material powder was first weighed in accordance with proportions described in Table 1. The raw-material powder contained a borosilicate glass powder (average particle size: 2.5 μm) including a composition satisfying a weight ratio of $SiO_2:B_2O_3:Al_2O_3:CaO:MgO:ZnO=49:8:18:21:1:3$; a quartz (α-quartz) powder; a $Nb_2O_5$ powder (average particle size: 0.5 μm); and an alumina powder (average particle size: 3 μm). To 100 parts by mass of the raw-material powder, an organic vehicle containing 14 parts by mass of an acrylic binder, 5 parts by mass of DOP serving as a plasticizer, and 30 parts by mass of toluene serving as a solvent was then added. The resultant mixture was mixed with a ball mill for about 40 hours to prepare slurry. The slurry was then shaped by a doctor-blade process into sheet-shaped bodies having an average thickness of 0.2 mm. Note that, in Sample No. 23 in Table 1, the glass powder was a borosilicate glass powder (average particle size: 2.5 μm) having a composition satisfying a weight ratio of $SiO_2:B_2O_3:Al_2O_3:CaO:BaO=43:8:6:5:38$.

Three sheets of the sheet-shaped bodies were then laminated and compressed to produce a green laminated body. The green laminated body was then fired for an hour at a maximum temperature described in Table 1. Thus, a mother substrate having a length of 60 mm, a width of 50 mm, and a thickness of 0.4 mm was produced.

The mother substrate was then cut with a dicing saw (DAD3350 manufactured by DISCO Corporation) so that ten sample pieces having a length of about 50 mm, a width of about 5 mm, and a thickness of about 0.4 mm were produced. These ten sample pieces after cutting were then observed with a stereoscopic microscope. Defects such as chipping generated in the sample pieces were observed and the maximum width in the direction perpendicular to the ridge is described in Table 1. All the sample pieces after cutting had small chipping near the ridges only.

Two sheets of the sheet-shaped bodies were then laminated and compressed to produce a green laminated body. The green laminated body was then cut and fired under the same conditions as in the substrate used for the evaluation for chipping. Thus, a substrate for measuring reflectivity was produced. The substrate for measuring reflectivity had a length of 30 mm, a width of 30 mm, and a thickness of 0.25 mm. This produced substrate was measured in terms of reflectivity with a spectrocolorimeter (CM-3700d manufactured by Konica Minolta Optics, Inc.) in the wavelength range of 360 to 720 nm. The reflectivities at 360 nm, 430 nm, 540 nm, and 700 nm were determined from the total reflectivity.

The proportions of the crystal grains and the glass matrix in the glass ceramic sinter were determined in the following manner: the glass ceramic sinter was pulverized and analyzed by X-ray diffractometry; the resultant main-peak positions were identified with reference to JCPDS and Rietveld analysis was performed.

The average grain size of the quartz grains in the glass ceramic sinter was determined in the following manner: a portion of the glass ceramic sinter cut from the mother substrate was embedded in resin; the section was polished; a micrograph of the internal structure of the polished sample was then taken with a scanning electron microscope; a circle covering about 50 crystal grains was drawn on the micrograph; crystal grains that were within the circle and on the circumference of the circle were selected; the outlines of the crystal grains were then subjected to image processing so that the areas of the crystal grains were measured; the diameters of circles having the same areas as the crystal grains were calculated; and the average of the diameters was calculated as the average grain size of the quartz grains. At this time, elements of main components in crystal grains were identified with an X-ray microanalyzer included in the scanning electron microscope; and a crystal grains in which Si and oxygen only were detected was identified as the quartz grains.

TABLE 1

| | Raw material | | | | | | Glass ceramic sinter Proportion of glass matrix and crystal grains (wt %) | | | | |
|---|---|---|---|---|---|---|---|---|---|---|---|
| | | Quartz powder | | | | | | | | | |
| Sample No. | Glass powder Content mass % | Content mass % | Average particle size μm | Alumina powder Content mass % | $Nb_2O_5$ powder Content mass % | Firing temperature °C. | Glass matrix (A) mass % | Anorthite (B) mass % | α-quartz (C) mass % | Fersmite (D) mass % | Alumina mass % |
| 1 | 75 | 20 | 4 | 0 | 5 | 930 | 29 | 45 | 20 | 6 | 0 |
| 2 | 65 | 20 | 4 | 0 | 15 | 920 | 24 | 39 | 20 | 17 | 0 |
| 3 | 70 | 10 | 4 | 0 | 20 | 900 | 25 | 42 | 10 | 23 | 0 |
| 4 | 75 | 5 | 4 | 0 | 20 | 900 | 27 | 45 | 5 | 23 | 0 |
| 5 | 70 | 5 | 4 | 0 | 25 | 900 | 24 | 42 | 5 | 29 | 0 |
| 6 | 65 | 5 | 4 | 0 | 30 | 900 | 21 | 39 | 5 | 35 | 0 |
| 7 | 60 | 5 | 4 | 0 | 35 | 900 | 18 | 36 | 5 | 41 | 0 |
| 8 | 55 | 5 | 4 | 0 | 40 | 900 | 16 | 33 | 5 | 46 | 0 |
| 9 | 77 | 3 | 4 | 0 | 20 | 900 | 28 | 46 | 3 | 23 | 0 |
| 10 | 68 | 2 | 4 | 0 | 30 | 910 | 22 | 41 | 2 | 35 | 0 |
| 11 | 75 | 5 | 30 | 0 | 20 | 880 | 27 | 45 | 5 | 23 | 0 |
| 12 | 75 | 5 | 20 | 0 | 20 | 880 | 27 | 45 | 5 | 23 | 0 |

TABLE 1-continued

| | | | | | | | | | | | |
|---|---|---|---|---|---|---|---|---|---|---|---|
| 13 | 75 | 5 | 10 | 0 | 20 | 890 | 27 | 45 | 5 | 23 | 0 |
| 14 | 75 | 5 | 1 | 0 | 20 | 940 | 27 | 45 | 5 | 23 | 0 |
| 15 | 75 | 5 | 4 | 0 | 20 | 860 | 27 | 45 | 5 | 23 | 0 |
| 16 | 75 | 5 | 4 | 0 | 20 | 880 | 27 | 45 | 5 | 23 | 0 |
| 17 | 75 | 5 | 4 | 0 | 20 | 920 | 27 | 45 | 5 | 23 | 0 |
| 18 | 75 | 5 | 4 | 0 | 20 | 940 | 27 | 45 | 5 | 23 | 0 |
| 19 | 75 | 5 | 4 | 0 | 20 | 960 | 27 | 45 | 5 | 23 | 0 |
| 20 | 70 | 0 | — | 10 | 20 | 900 | 19 | 48 | 0 | 23 | 10 |
| 21 | 70 | 5 | 2 | 0 | 25 | 900 | 24 | 42 | 5 | 29 | 0 |
| 22 | 70 | 30 | 4 | 0 | 0 | 900 | 28 | 42 | 30 | 0 | 0 |
| 23 | 75 | 20 | 4 | 0 | 5 | 900 | 73 | 0 | 20 | 7 | 0 |
| 24 | 70 | 0 | — | 0 | 30 | 900 | 28 | 42 | 0 | 30 | 0 |
| 25 | 71 | 9 | 4 | 1 | 20 | 900 | 24 | 43 | 9 | 23 | 1 |
| 26 | 72 | 8 | 4 | 2 | 20 | 900 | 24 | 43 | 8 | 23 | 2 |
| 27 | 75 | 5 | 4 | 5 | 20 | 900 | 22 | 45 | 5 | 23 | 5 |

| | Glass ceramic sinter | | | | | | | | | |
|---|---|---|---|---|---|---|---|---|---|---|
| Sample No. | A + B + C mass % | A + B + D mass % | A + C + D mass % | Total content of glass matrix and crystal grains except for alumina mass % | Average grain size of α-quartz μm | Reflectivity (%) 360 nm % | 430 nm % | 540 nm % | 700 nm % | Width of defect during dicing |
| 1 | 94 | 80 | 55 | 100 | 3.6 | 80 | 80 | 85 | 84 | 40 μm |
| 2 | 83 | 80 | 61 | 100 | 3.6 | 85 | 90 | 90 | 91 | 40 μm |
| 3 | 77 | 90 | 58 | 100 | 3.6 | 87 | 91 | 90 | 90 | 40 μm |
| 4 | 77 | 95 | 55 | 100 | 3.6 | 88 | 93 | 93 | 92 | 40 μm |
| 5 | 71 | 95 | 58 | 100 | 3.6 | 88 | 93 | 94 | 93 | 40 μm |
| 6 | 65 | 95 | 61 | 100 | 3.6 | 89 | 94 | 95 | 93 | 40 μm |
| 7 | 59 | 95 | 64 | 100 | 3.6 | 89 | 94 | 95 | 93 | 40 μm |
| 8 | 54 | 95 | 67 | 100 | 3.6 | 86 | 93 | 94 | 92 | 40 μm |
| 9 | 77 | 97 | 54 | 100 | 3.6 | 81 | 87 | 88 | 87 | 50 μm |
| 10 | 65 | 98 | 59 | 100 | 3.6 | 79 | 85 | 86 | 87 | 70 μm |
| 11 | 77 | 95 | 55 | 100 | 27.0 | 81 | 87 | 88 | 87 | 90 μm |
| 12 | 77 | 95 | 55 | 100 | 18.0 | 83 | 89 | 89 | 90 | 70 μm |
| 13 | 77 | 95 | 55 | 100 | 9.0 | 86 | 92 | 93 | 92 | 55 μm |
| 14 | 77 | 95 | 55 | 100 | 0.9 | 69 | 73 | 83 | 82 | 40 μm |
| 15 | 77 | 95 | 55 | 100 | 3.6 | 85 | 92 | 92 | 91 | 40 μm |
| 16 | 77 | 95 | 55 | 100 | 3.6 | 85 | 92 | 92 | 91 | 40 μm |
| 17 | 77 | 95 | 55 | 100 | 3.7 | 86 | 93 | 93 | 92 | 40 μm |
| 18 | 77 | 95 | 55 | 100 | 3.8 | 86 | 93 | 93 | 92 | 40 μm |
| 19 | 77 | 95 | 55 | 100 | 3.9 | 86 | 93 | 92 | 92 | 40 μm |
| 20 | 67 | 90 | 42 | 90 | — | 69 | 90 | 92 | 94 | 100 μm |
| 21 | 71 | 95 | 58 | 100 | 1.8 | 87 | 91 | 90 | 90 | 40 μm |
| 22 | 100 | 70 | 58 | 100 | 3.8 | 68 | 74 | 77 | 77 | 40 μm |
| 23 | 93 | 80 | 100 | 100 | 3.8 | 68 | 75 | 78 | 78 | 60 μm |
| 24 | 70 | 100 | 58 | 100 | — | 68 | 85 | 88 | 88 | 50 μm |
| 25 | 76 | 90 | 56 | 99 | 3.6 | 80 | 90 | 90 | 90 | 40 μm |
| 26 | 75 | 90 | 55 | 98 | 3.6 | 76 | 88 | 90 | 90 | 60 μm |
| 27 | 72 | 90 | 50 | 95 | 3.6 | 73 | 88 | 90 | 90 | 100 μm |

As is clear from the results in Table 1, in Samples No. 1 to 19, 21, 25, and 26, the width of chipping during cutting employing a dicing saw was 90 μm or less. In addition, all these Samples had a reflectivity of 69% or more in the wavelength of 360 to 700 nm.

In Samples No. 2 to 8, 13, 15 to 19, and 21, in which, in each glass ceramic sinter, the content of the glass matrix was 16% to 28% by mass of the glass ceramic sinter, the content of the anorthite grains was 33% to 45% by mass of the glass ceramic sinter, the content of the quartz grains was 5% to 20% by mass of the glass ceramic sinter, the content of the fersmite grains was 17% to 46% by mass of the glass ceramic sinter, and the average grain size of the quartz grains was 1.8 to 9.0 μm, the reflectivity was 85% or more at 360 nm.

In Samples No. 3 to 7 and 21, in which, in each glass ceramic sinter, the content of the glass matrix was 18% to 27% by mass of the glass ceramic sinter, the content of the anorthite grains was 36% to 45% by mass of the glass ceramic sinter, the content of the quartz grains was 5% to 10% by mass of the glass ceramic sinter, the content of the fersmite grains was 23% to 41% by mass of the glass ceramic sinter, and the average grain size of the quartz grains was 1.8 to 3.6 μm, the reflectivity was 87% or more at 360 nm.

In contrast, in Samples (Samples No. 20 and 27) containing, instead of the quartz (α-quartz) powder, 5% or more by mass of the alumina powder, the width of chipping during cutting employing a dicing saw was 100 μm.

In the cases (Samples No. 22 to 24) where, in the glass matrix, any one crystal grains among the anorthite grains, the quartz grains, and the fersmite grains was not present, the width of chipping during dicing was 60 µm or less but these Samples had a low light reflectivity of 68% or less at the wavelength of 360 nm.

REFERENCE SIGNS LIST 1 glass ceramic sinter
3 defect
11 mounting section
13 insulating base
15 conductor layer
17 feedthrough conductor
19 reflective member

The invention claimed is:

1. A glass ceramic sinter comprising:
    a glass matrix; and
    anorthite grains, fersmite grains and quartz grains, all of which are in the glass matrix,
    wherein a total content of the glass matrix, the anorthite grains, the quartz grains, and the fersmite grains is 98% or more by mass of the glass ceramic sinter.

2. The glass ceramic sinter according to claim 1, wherein a content of the glass matrix is 16% to 28% by mass of the glass ceramic sinter, a content of the anorthite grains is 33% to 45% by mass of the glass ceramic sinter, a content of the quartz grains is 5% to 20% by mass of the glass ceramic sinter, and a content of the fersmite grains is 17% to 46% by mass of the glass ceramic sinter,
    wherein the quartz grains have an average grain size of 1.8 to 9.0 µm.

3. The glass ceramic sinter according to claim 1, wherein a content of the glass matrix is 18% to 27% by mass of the glass ceramic sinter, a content of the anorthite grains is 36% to 45% by mass of the glass ceramic sinter, a content of the quartz grains is 5% to 10% by mass of the glass ceramic sinter, and a content of the fersmite grains is 23% to 41% by mass of the glass ceramic sinter,
    wherein the quartz grains have an average grain size of 1.8 to 3.6 µm.

4. A reflective member comprising the glass ceramic sinter according to claim 1.

5. A substrate for mounting a light-emitting-element comprising:
    an insulating base comprising:
        a surface; and
        a mounting section on the surface; and
    a reflective member disposed on the surface and surrounding the mounting section,
    wherein at least one of the insulating base and the reflective member comprises the glass ceramic sinter according to claim 1.

6. A light-emitting device comprising:
    a light-emitting element mounted on the mounting section of the substrate according to claim 5.

* * * * *